United States Patent [19]

Sameshima

[11] Patent Number: 5,406,196
[45] Date of Patent: Apr. 11, 1995

[54] MAXIMUM VOLTAGE DETECTING APPARATUS USING FERROELECTRIC SUBSTANCE

[75] Inventor: Katsumi Sameshima, Kyoto, Japan

[73] Assignee: Rohm Co., Ltd., Kyoto, Japan

[21] Appl. No.: 953,809

[22] Filed: Sep. 30, 1992

[30] Foreign Application Priority Data

Oct. 2, 1991 [JP] Japan .................................. 3-255053
Oct. 15, 1991 [JP] Japan .................................. 3-265715
Oct. 16, 1991 [JP] Japan .................................. 3-267817

[51] Int. Cl.⁶ .......................................... G01R 19/04
[52] U.S. Cl. ................................. 324/103 P; 324/72
[58] Field of Search ............... 324/103 P, 102, 122, 324/72, 457, 458, 109; 365/145, 149

[56] References Cited

U.S. PATENT DOCUMENTS

| | | | |
|---|---|---|---|
| 1,649,180 | 11/1927 | Peters | 324/102 |
| 1,942,384 | 1/1934 | Foust | 324/102 |
| 2,247,808 | 7/1941 | Hall | 324/102 |
| 2,537,384 | 1/1951 | Waghorne | 324/102 |
| 2,870,407 | 1/1959 | Baker | 324/102 |
| 3,141,107 | 7/1964 | Wasserman | 324/122 |
| 4,106,107 | 8/1978 | Goodman | 324/457 |
| 4,825,152 | 4/1989 | Bossard | 324/72 |
| 5,031,144 | 7/1991 | Persky | 365/145 |
| 5,155,573 | 10/1992 | Abe et al. | 365/145 |

*Primary Examiner*—Ernest F. Karlsen
*Attorney, Agent, or Firm*—Oliff & Berridge

[57] ABSTRACT

A maximum voltage detecting apparatus for measuring the output maximum voltage, such as of an optical sensor, a thermal sensor or a wind sensor, utilizing a ferroelectric substance. A d.c. power source of a reset circuit applies a d.c. voltage to a ferroelectric device to generate a maximum spontaneous polarization, the ferroelectric device including metal electrodes and a PZT ferroelectric substance held therebetween. The output voltage such as from the wind sensor is applied to the ferroelectric device so as to have an opposite polarity. A polarization measuring circuit measures a residual polarization in the ferroelectric device by this output voltage and measures a maximum output voltage value from the residual polarization value.

12 Claims, 13 Drawing Sheets

MAXIMUM VOLTAGE DETECTING APPARATUS USING FERROELECTRIC SUBSTANCE

BACKGROUND OF THE INVENTION

1. Field of the Invention

This invention relates to a maximum voltage detecting apparatus, and more particularly to such apparatus for detecting the maximum output voltage of an equipment, which generates a potential, such as a light sensor, a heat sensor or a pressure sensor with no power source.

2. Description of the Related Art

A light sensor, a heat sensor, a pressure sensor or a wind sensor generates a potential corresponding to the amount of light, heat or pressure. It is well known in the art to use a comparator 10 such as shown in FIG. 1 of the accompanying drawings for monitoring whether or not the potential exceeds a predetermined value. The comparator 10 usually includes a current mirror circuit 10a and a differentiation circuit 10b. A voltage corresponding to the difference between a non-inverted input terminal and an inverted input terminal is used as the output. A means for generating the potential such as of the light sensor or heat sensor is connected to the non-inverted input terminal, and a reference voltage is applied to the inverted input terminal, so that it is monitored whether the external voltage such as of the light sensor or heat sensor exceeds the reference voltage.

However, the conventional voltage measuring means such as a comparator cannot be operative until an external voltage is supplied from a power source 10c. Further, to monitor a maximum voltage all the time, an external memory has to be connected with the output terminal of the comparator to store the output thereof.

SUMMARY OF THE INVENTION

With the foregoing problems of the conventional technology in mind, it is an object of this invention to provide a maximum voltage detecting apparatus for detecting a maximum voltage with non-volatility without the need for a power supply.

To accomplish the above object, in the invention the maximum voltage is measured utilizing a spontaneous polarization in a ferroelectric substance. A ferroelectric substance is a dielectric which has a spontaneous polarization based on a permanent twin-polarity moment and which can be inverted in the polarizing direction by impressing an electric field.

Therefore according to a first aspect of the invention, there is provided, a maximum voltage detecting apparatus comprising: a ferroelectric device; a reset circuit for generating a maximum spontaneous polarization in the ferroelectric device; and a polarization detecting circuit for detecting an inverted polarization generated in the ferroelectric device as an external voltage to be detected is applied to the ferroelectric device. The maximum voltage is detected from a residual polarization value of the ferroelectric device which polarization is generated by the external voltage.

As is well known, in the case where a plurality of ferroelectric devices are different in thickness from one another, they will each have substantially the same maximum spontaneous polarization value, and will increase in an anti-electric field value needed to invert a spontaneous polarization, in proportion to the thickness. Therefore, assuming that the plural ferroelectric devices with different thicknesses are connected in parallel to one another and are impressed by a voltage, if an external voltage is greater than the anti-electric field of one ferroelectric device, the spontaneous polarization of this ferroelectric device will be inverted while the spontaneous polarization of each of the remaining ferroelectric devices will not be inverted.

Thus according to a second aspect of the invention, there is provided a maximum voltage detecting apparatus comprising: a ferroelectric unit composed of a plurality of ferroelectric devices which are different in thickness and are connected in parallel to one another; a reset circuit for generating a maximum spontaneous polarization in all of the ferroelectric devices of the ferroelectric unit; and a polarization detecting circuit for detecting an inverted polarization generated in each of the ferroelectric devices of the ferroelectric unit as an external voltage to be detected is applied to each ferroelectric device.

DETAILED DESCRIPTION

A maximum voltage detecting apparatus according to a first embodiment of this invention will now be described with reference to the accompanying drawings.

Figure 1:
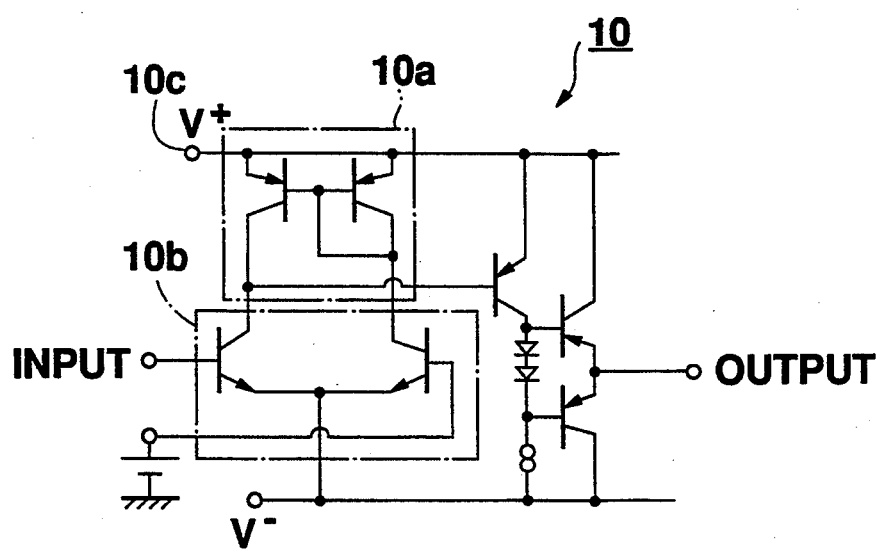
FIG. 1 is a circuit diagram of a conventional maximum voltage detecting apparatus.
Figure 2:
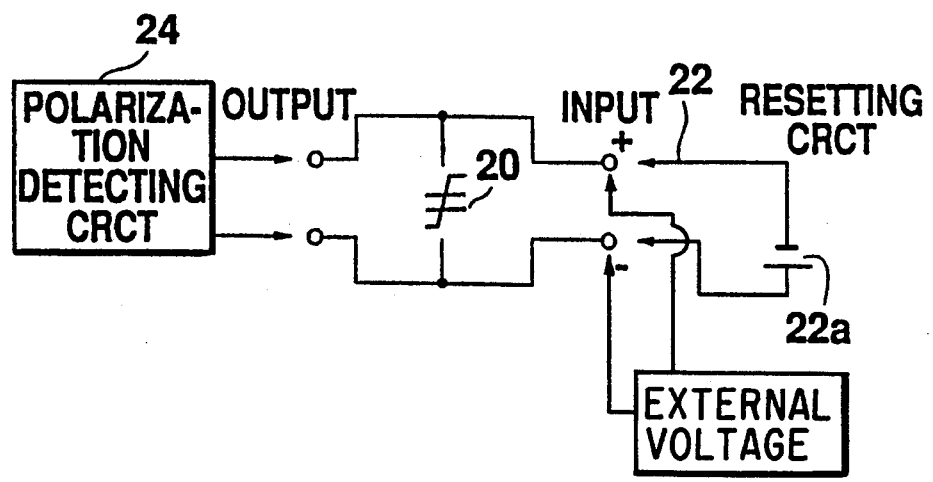
FIG. 2 is a view schematically showing a maximum voltage detecting apparatus according to a first embodiment of this invention.
Figure 3:
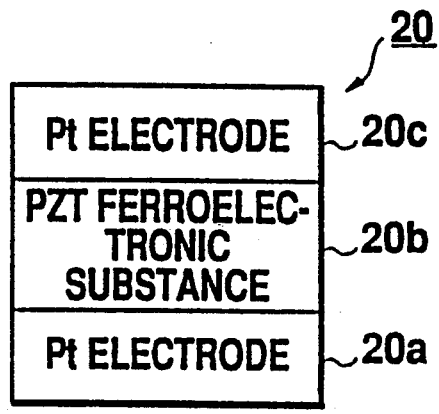
FIG. 3 is a view schematically showing a ferroelectric device of FIG. 2.

FIG. 2 shows the whole structure of the apparatus of tile first embodiment. The apparatus includes a ferroelectric device 20 which has platinum electrodes 20a and 20c, and a PZT (lead zirco-titanate) ferroelectric substance 20b sandwiched between the platinum electrodes 20a and 20c, as shown in FIG. 3.

The apparatus also has a reset circuit 22 for generating a spontaneous polarization in the ferroelectric device 20. The reset circuit 22 includes a d.c. power source 22a for applying a d.c. voltage to the PZT ferroelectric substance 20b of the ferroelectric device 20 via the platinum electrodes 20a, 20c to generate a maximum spontaneous polarization Pr. The voltage of the d.c. power source 22a should vary depending on the thickness of PZT and should be capable of impressing an adequate electric field to generate a maximum spontaneous polarization. In this embodiment, the thickness of PZT is 300 nm and the voltage of the d.c. power source 22a is 5 V.

Figure 4:
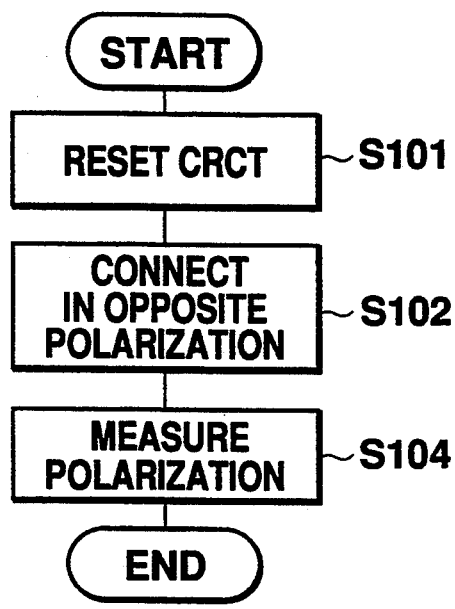
FIG. 4 is a flow diagram showing how the apparatus of the first embodiment operates.
Figure 5:
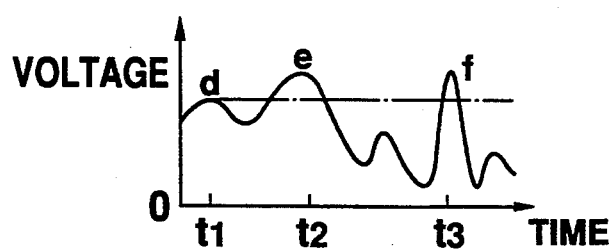
FIG. 5 is a graph showing the output characteristic of a wind sensor in the first embodiment.

FIG. 4 is a flow diagram showing the detecting process according to this embodiment. At step 101, using the reset circuit 22, the voltage output from a wind sensor is connected to the ferroelectric device 20 so as to have an opposite polarity to the polarity of the wind sensor (S102). FIG. 5 shows one example of the output voltage characteristic of the wind sensor; the x coordinate and the y coordinate respectively represent time and output voltage, and peak output values d, e and f are at time $t_1$, $t_2$ and $t_3$, respectively. When an external voltage having such a characteristic is applied to the ferroelectric device 20, the ferroelectric device 20 will be undergo the following changes.

Figure 6:
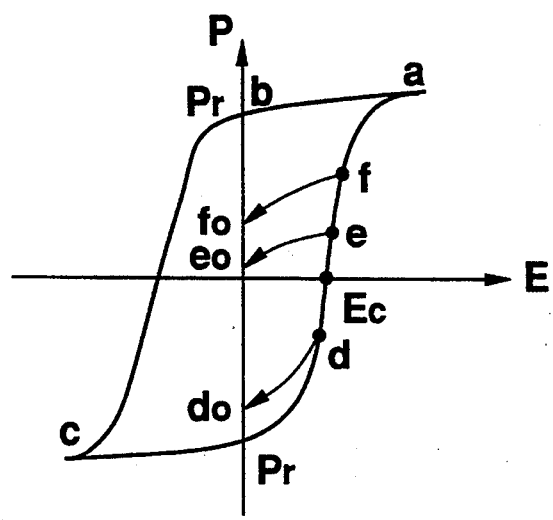
FIG. 6 is a graph showing a P-E hysteresis loop of the ferroelectric device of FIG. 2.

FIG. 6 shows an P-E hysteresis loop of the ferroelectric device 20. In the case where a d.c. voltage is impressed from the reset circuit in the reset process of step 101, the ferroelectric device is first moved from the origin to a point c in FIG. 6, and when the reset circuit 22 is disconnected, it is then moved from the point c to the point of maximum spontaneous polarization Pr. Thence when the wind sensor's output voltage having the characteristic of FIG. 4 is impressed to the ferroelectric device 20, it is first moved to a point d of the hysteresis loop. Then when time passes to reach $t_2$, the output voltage value will be a peak value e; in this case, the ferroelectric device 20 will be moved to the point e of the hysteresis loop of FIG. 6. Further when time passes to reach $t_3$, the output voltage will be a peak value f, and the ferroelectric device 20 will be moved to a point f of the hysteresis loop. After passing each peak value d, e and f, the output voltage value decreases, and also the ferroelectric device 20 is moved from d to $d_o$, from e to $e_o$ and from f to $f_o$, respectively, in the directions of arrows, depending on the impressed voltage. Unless a voltage exceeding the output voltage value f is impressed to the ferroelectric device 20, the polarization $f_o$ will remain in the ferroelectric device 20. Therefore, by measuring this residual polarization $f_o$ by a polarization detecting circuit 24, it is possible to detect a maximum voltage impressed to the ferroelectric device 20 (Step 104).

Figure 7A:
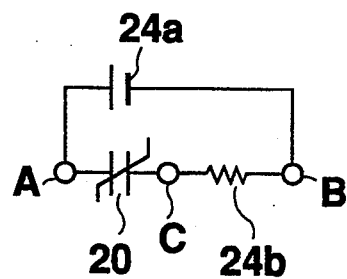
FIG. 7A is a circuit diagram showing a polarization detecting circuit in the first embodiment.
Figure 7B:
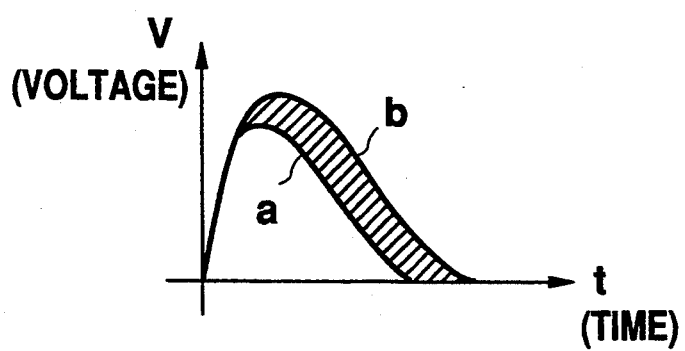
FIG. 7B is a graph showing the principle of detecting a polarization.

FIGS. 7A and 7B show the structure and principle, respectively, of the polarization detecting circuit 24. The polarization detecting circuit 24 includes a d.c. power source 24a (which may be identical with the d.c. power source 22a of the reset circuit 22) for generating a maximum spontaneous polarization in the ferroelectric device 20, and a resistor 24b. By monitoring a voltage or a current between points B and C, the residual polarization will be detected.

Thus assuming that a voltage is impressed between points A and B to generate a maximum spontaneous polarization in the ferroelectric device 20 and that fluctuation of the voltage between the points B and C is measured at that time, the polarization of the ferroelectric device 20 will be inverted. If the ferroelectric device 20 already has the maximum spontaneous polarization Pr, the voltage fluctuation will be such as indicated by a in FIG. 7B. If the residual polarization of the ferroelectric device is, for example, $f_o$ in FIG. 6, the voltage fluctuation will be such as indicated by b in FIG. 7B. That is, if the ferroelectric device 20 already has a maximum spontaneous polarization, the residual polarization will not vary the P-E hysteresis loop. If the residual polarization is not a maximum spontaneous polarization, it will vary not along the P-E hysteresis loop.

Thus if the residual polarization is not a maximum spontaneous polarization, the voltage (or current) will vary such as indicated at b in FIG. 7B. Therefore, by impressing a predetermined voltage twice between the points A and B and then obtaining a difference (hatched portion in FIG. 7B) of the two voltage (or current) change, it is possible to measure the residual polarization (if the residual polarization is already the maximum spontaneous polarization Pr, the difference will be 0; if not, the difference will be a value commensurate with the residual polarization).

Figure 8:
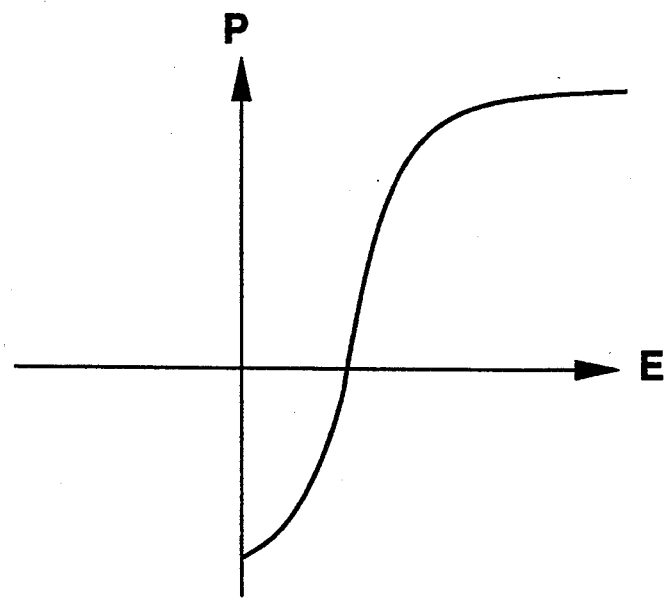
FIG. 8 is a graph showing the relation between an external electric field and a residual polarization of the ferroelectric device.

FIG. 8 shows the relationship between an external electric field E impressed to the ferroelectric device 20 and a residual polarization P at that time. By measuring the relationship between the external electric field and the residual polarization value prior to measuring actual external voltages, it is possible to calculate a maximum value of the impressed external voltage from the residual polarization value measured by the polarization detecting circuit 24.

Figure 9:
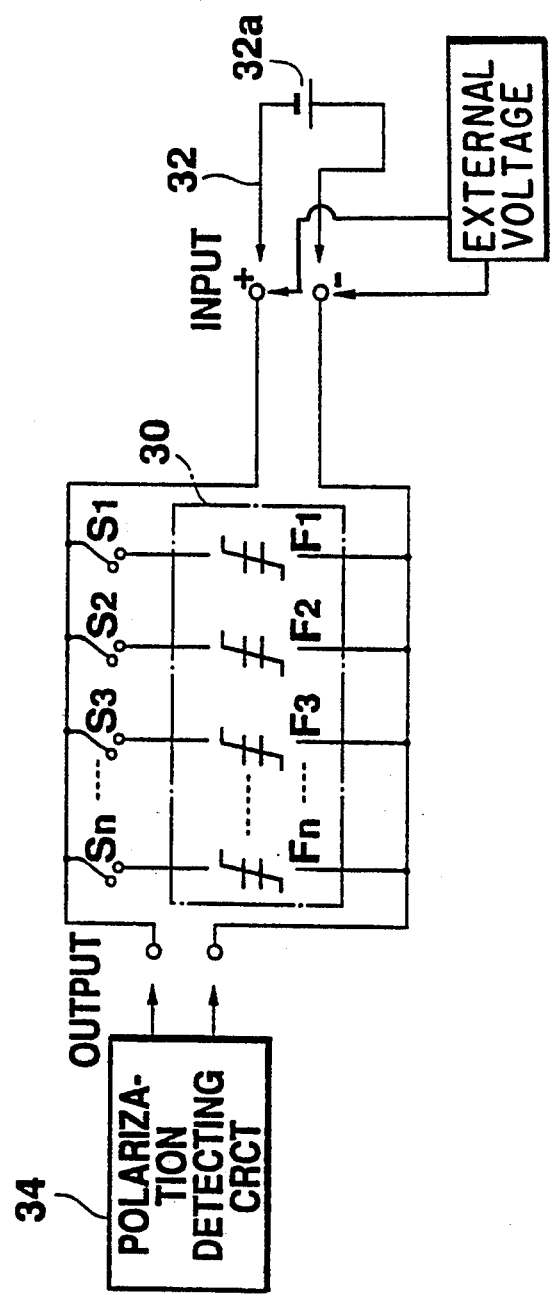
FIG. 9 is a view schematically showing a modified maximum voltage detecting apparatus according to a second embodiment.

FIG. 9 shows the whole structure of a modified maximum voltage detecting apparatus according to a second embodiment. The apparatus of the second embodiment has a ferroelectric unit 30 composed of a plurality of parallel connected ferroelectric devices $F_1$, $F_2$, $F_3$, . . . , $F_n$. Each ferroelectric device includes, as shown in FIG. 3, a pair of platinum electrodes 20a, 20c and a PZT (lead zirco-titanate) ferroelectric substance 20b held between the platinum electrodes 10a, 20c, each PZT ferroelectric substance having a different thickness. In this embodiment, the PZT ferroelectric substances of the ferroelectric devices $F_1$, $F_2$, $F_3$, . . . , $F_n$ increase in thickness gradually in this order. That is, assuming that the respective PZT ferroelectric substance thicknesses of the ferroelectric devices $F_1$ through $F_n$ are $d_1$ through $d_n$, $d_1 < d_2 < d_3 < \ldots < d_n$. Switches $S_1$ through $S_n$ are connected to the respective ferroelectric devices $F_1$ through $F_n$ in series.

Figure 10:
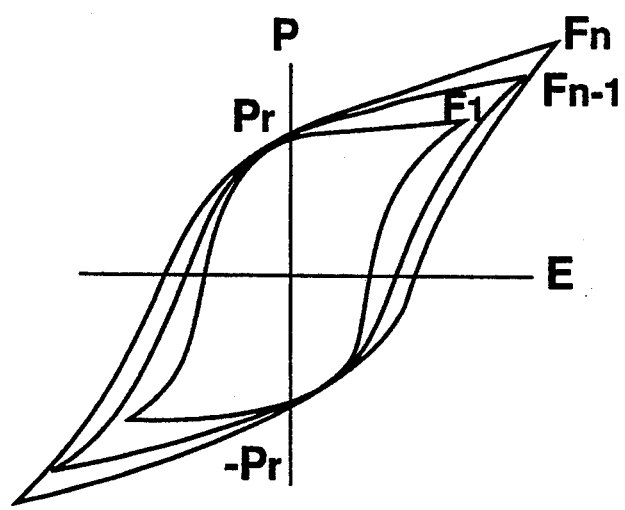
FIG. 10 is a graph showing P-E hysteresis loops of the ferroelectric devices of FIG. 9.

The apparatus further has a reset circuit 32 for generating a spontaneous polarization in the PZT ferroelectric unit 30. The reset circuit 32 includes a d.c. power source 32a for applying a d.c. voltage to the PZT ferroelectric substance of each of the ferroelectric devices $F_1$ through $F_n$ via the platinum electrodes to generate a maximum spontaneous polarization Pr. Although the PZT ferroelectric substance of each ferroelectric device $F_1$ through $F_2$ has a different thickness, the maximum spontaneous polarization Pr will be a value substantially equal to that above-described in connection with the first embodiment. The voltage of the d.c. power source 32a should vary depending on the thickness of the PZT ferroelectric substance and, in this embodiment, it should be sufficient to impress an adequate electric field to generate a maximum spontaneous polarization in the ferroelectric device $F_n$ whose PZT ferroelectric substance has a maximum thickness. FIG. 10 shows the respective P-E hysteresis loops of the ferroelectric devices $F_1$, through $F_n$. As understood from FIG. 10, the larger the thickness of the PZT ferroelectric substance, the higher the electric field needed to invert the polarization, i.e., the anti-electric field will increase. On the other hand, the maximum spontaneous polarization Pr is substantially constant.

After the maximum spontaneous polarization Pr is generated in the individual ferroelectric device $F_1$ through $F_n$ of the ferroelectric unit 30 by the reset circuit 32, the external voltage to be measured is connected with the ferroelectric unit 30 so as to be inverted in polarity, and then the maximum value of the external voltage is measured. Subsequently, the process of calculating this maximum voltage value will now be described, taking as an example the case of measuring the voltage from a wind sensor.

Figure 11:
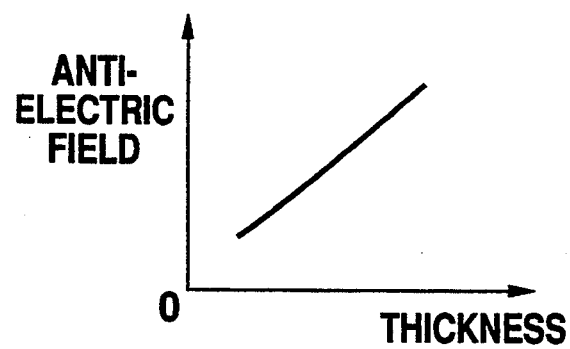
FIG. 11 is a graph showing the relation between the thickness and anti-electric field of the individual ferroelectric device of FIG. 9.

In this embodiment, like the first embodiment, the maximum spontaneous polarization Pr is generated in each ferroelectric device $F_1$ through $F_n$ of the ferroelectric unit 30 by the reset circuit 32. Then the voltage outputted from the wind sensor is connected to the ferroelectric unit 30 so as to be opposite in polarity to the polarity of the reset circuit 32. At that time, all of the switches $S_1$ through $S_n$ are turned on. When the external voltage shown in FIG. 5 is impressed to each of the ferroelectric device $F_1$ through $F_n$ of the ferroelectric unit 30, the spontaneous polarization of each ferroelectric device $F_1-F_n$ varies along the P-E hysteresis loop. As shown in FIG. 11, as the thickness of the PZT ferroelectric substance increases, the strength of the anti-electric field need to generate an inverted polarity will also increase substantially in proportion to the thickness. Therefore, when the electric field corresponding to the maximum output voltage value f of the wind sensor exceeds the anti-electric field, a polarization inversion will be caused. Assuming that the thicknesses of the PZT ferroelectric substances of the respective ferroelectric devices $F_1$, $F_2$, $F_3$ and $F_4$, for example, are adjusted to set the voltages corresponding to the anti-electric fields respectively as 1 V, 2 V, 3 V and 4 V, if the voltage of 2.5 V is impressed, the ferroelectric devices $F_1$ and $F_2$ having the anti-electric fields of 1 V and 2 V are inverted in polarization, and the polarization directions of the ferroelectric devices $F_3$ and $F_4$ having the anti-electric fields of 3 V and 4 V are maintained.

Then, by connecting the output terminal of the ferroelectric unit to a polarization detecting circuit 34 and turning the switches $F_1$ through $F_n$ on in order to check whether or not the polarization is inverted, it is possible to detect the maximum output voltage of a wind sensor. In the previous case, since the ferroelectric devices $F_1$ and $F_2$ are inverted in polarization and the ferroelectric devices $F_3$ and $F_4$ are not inverted in polarization, it is detected that the maximum output voltage is in the range of 2 V to 3 V.

Thus utilizing that the anti-electric field varies as the ferroelectric substance has a different thickness, it is possible to define a range of the output voltage by detecting whether or not the polarization is inverted. Alternatively, the following method may be used to measure the output voltage accurately.

Figure 12:
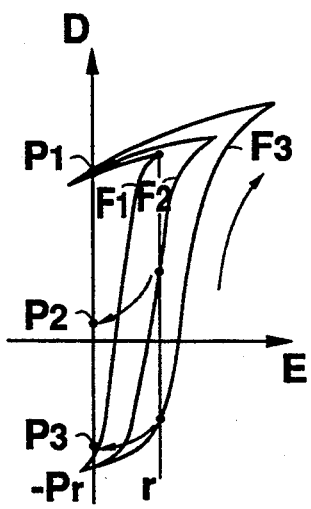
FIG. 12 is a fragmentary enlarged view of the P-E hysteresis loops of FIG. 10.

FIG. 12 shows a part of the P-E hysteresis loop of each ferroelectric device of FIG. 10. If the output voltage f is applied to the individual ferroelectric device set to a maximum spontaneous polarization Pr by the reset, the ferroelectric device $F_1$ will be polarized to the maximum. If this output voltage f is 0, it will be the residual polarization $P_1$ (=Pr). Further, if the output voltage f is impressed, the ferroelectric device $F_2$ will be inverted in polarization likewise the ferroelectric $F_1$. However, the polarization will be done short of the maximum. When the output voltage f is 0, the residual polarization $P_2$ will be caused. In the case of ferroelectric device $F_3$, on the other hand, even if the output voltage f is impressed, the inverted polarization will not be generated. Therefore, also if the output voltage f is 0, the residual polarization $P_3$ of the same direction will be generated.

Figure 13:
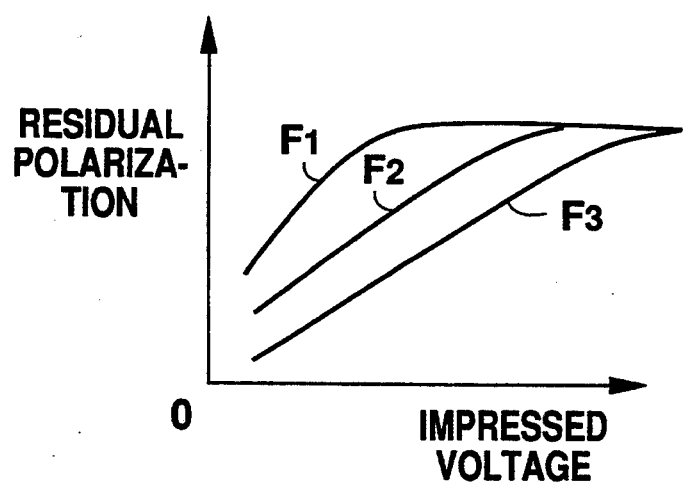
FIG. 13 is a graph showing the relation between the impressed voltage and residual polarization of the individual ferroelectric devices of FIG. 9.

By previously obtaining the relation between the impressed voltage and residual polarization of each ferroelectric device, as shown in FIG. 13, utilizing that the value of the residual polarization depends on the impressed voltage and by checking the residual polarizations of the individual ferroelectric devices $F_1$ through Fn, which polarizations are obtained by the above-mentioned polarization detecting circuit 34, it is possible to determine a maximum voltage accurately.

Figure 14:
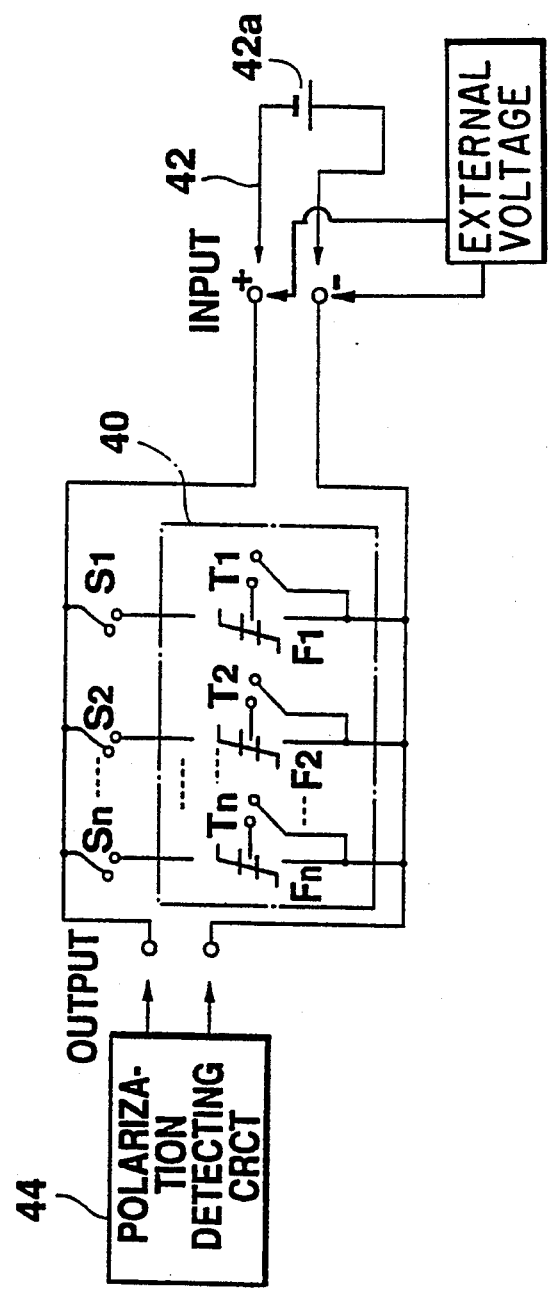
FIG. 14 is a view schematically showing another modified maximum voltage detecting apparatus according to a third embodiment.
Figure 15:
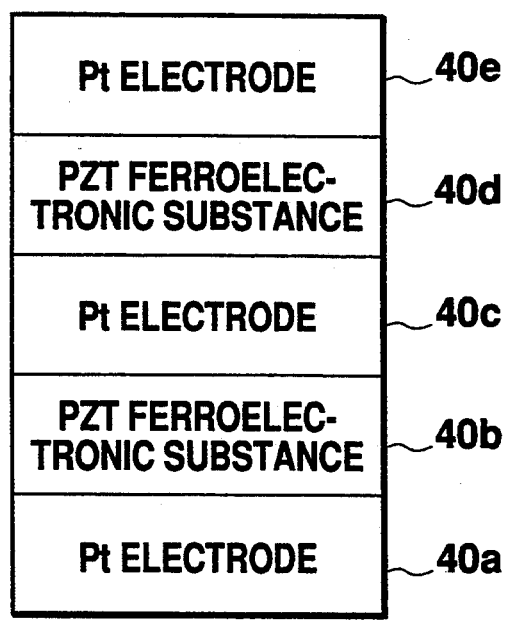
FIG. 15 is a view schematically showing each of ferroelectric devices of FIG. 14.

FIG. 14 shows the whole structure of a modified maximum voltage detecting apparatus according to a third embodiment. The apparatus of the second embodiment has a ferroelectric unit 40 composed of a plurality of parallel connected ferroelectric devices $F_1$, $F_2$, $F_3$, . . . , $F_n$. Each ferroelectric device includes, as shown in FIG. 15, a platinum electrode 40a, a PZT (lead zircotitanate) ferroelectric substance 40b, a platinum electrode 40c, a PZT ferroelectric substance 40d and a platinum electrode 40e laminated in order. The PZT ferroelectric substances 40d of the individual ferroelectric devices $F_1$ through $F_n$ have a common thickness, and the PZT ferroelectric substances 40b of the individual ferroelectric devices $F_1$ through $F_n$ have different thickness. Since each ferroelectric device has a standard portion (PZT ferroelectric substance 40d) of a common thickness and a variable portion (PZT ferroelectric substance 40b) of a different thickness, the individual ferroelectric devices $F_1$ through $F_2$ have different thicknesses. The thicknesses of the variable portions are adjusted in such a manner that the ferroelectric devices $F_1$ through $F_n$ increase in thickness gradually in order. That is, assuming that the respective PZT ferroelectric substance thicknesses of the ferroelectric devices $F_1$ through $F_1$ are $d_1$ through $d_n$, $d_1 < d_2 < d_3 < \ldots < d_n$.

Switches $S_1$ through Sn are connected to the respective ferroelectric devices $F_1$ through $F_n$ in series. Further there are provided switches $T_1$ through $T_n$ for applying a voltage to the platinum electrode 40c of each ferroelectric device $F_1-F_n$.

The apparatus further has a reset circuit 42 for generating a spontaneous polarization in the PZT ferroelectric unit 40. The reset circuit 42 includes a d.c. power source 42a for applying a d.c. voltage to the PZT ferroelectric substances 40b, 40d of each of the ferroelectric devices $F_1$ through $F_n$ via the platinum electrodes 40a, 40e at opposite ends to generate a maximum spontaneous polarization Pr. Although the PZT ferroelectric substance of each ferroelectric device $F_1$ through $F_n$ has a different thickness, the maximum spontaneous polarization Pr will be a value substantially equal to that above-described in connection with the first; embodiment. The voltage of the d.c. power source 32a should vary depending on the thickness of PZT ferroelectric substance and, in this embodiment, it should be sufficient to impress an adequate electric field to generate a maximum spontaneous polarization in the ferroelectric device $F_n$ whose PZT ferroelectric substance has a maximum thickness.

After the maximum spontaneous polarization Pr is generated in the individual ferroelectric device $F_1$ through $F_n$ of the ferroelectric unit 40 by the reset circuit 42, the external voltage to be measured is connected with the ferroelectric unit 40 so as to be inverted in polarity, and then the maximum value of the external voltage is measured.

Figure 16:
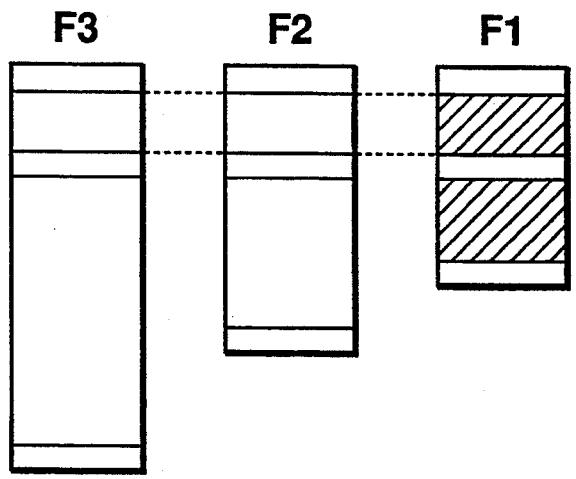
FIGS. 16 and 17 illustrates inverted polarizations of the ferroelectric devices of FIG. 14.
Figure 17:
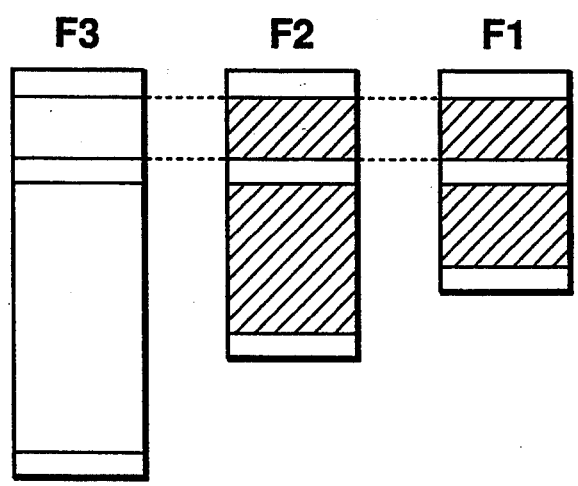

In this embodiment, like the first and second embodiment, the maximum spontaneous polarization Pr is generated in each ferroelectric device $F_1$ through $F_n$ of the ferroelectric unit 40 by the reset circuit 32. Then the voltage outputted from the wind sensor is connected to tile ferroelectric unit 40 so as to be opposite in polarity to the polarity of the reset circuit 42. At that time, all of the switches $S_1$ through $S_n$ are turned on, and all of the switches $T_1$ through $T_n$ are turned off. When the external voltage is impressed to each of the ferroelectric devices $F_1$ through $F_n$ of the ferroelectric unit 40, the spontaneous polarization of each ferroelectric device $F_1-F_n$ varies along the P-E hysteresis loop. As the thickness of the PZT ferroelectric substance increases, the strength of the anti-electric field needed to generate an inverted polarity will also increase substantially in proportion to the thickness. Therefore, when the electric field corresponding to the maximum output voltage value f exceeds the anti-electric field, a polarization inversion will be caused. Assuming that the thicknesses of the PZT ferroelectric substances 40b, 40d of the respective ferroelectric devices $F_1$, $F_2$ and $F_3$, for example, are adjusted to set the voltages corresponding to the anti-electric fields respectively as 1 V, 2 V and 3 V, if the voltage of 1.5 V is impressed, only the ferroelectric device $F_1$ of FIG. 16 will be inverted in polarization, and the polarization directions of the ferroelectric devices $F_2$ and $F_3$ are maintained. If the voltage of 2.5 V is impressed, the ferroelectric devices $F_1$ and $F_3$ having the anti-electric fields of 1 V and 2 V will be inverted in polarization, and the polarization directions of the ferroelectric device $F_3$ and $F_4$ having the anti-electric fields of 3 V and 4 V will be maintained.

To detect the state of polarization of each ferroelectric device $F_1-F_n$ of the ferroelectric unit 40, the switch $S_1$ and the switch $T_1$ are turned on, and all of the remaining switches are turned off, whereupon the polarization detecting circuit 44 is connected to the output terminal.

After the measurement of the ferroelectric device $F_1$ is completed, the switches $S_2$ and $T_2$ are turned on, and all of the remaining switches are turned off, whereupon the measurement of the ferroelectric device $F_2$ is performed in the same manner. At that time, since the residual polarization of the ferroelectric device $F_2$ is measured at the standard portion (PZT ferroelectric substance 40d) having a thickness equal to that of the ferroelectric device $F_1$, it is possible to measure the d.c. power source of the polarization detecting circuit 44 at the same low voltage.

Likewise by measuring the residual polarizations of all of the ferroelectric device $F_1$ through $F_n$ of the ferroelectric unit 40, it is possible to check whether or not the polarization is inverted. If the ferroelectric devices $F_1$ and $F_2$ are inverted in polarization and the ferroelectric devices $F_3$ and $F_4$ are not inverted in polarization, it will be detected that the maximum output voltage is in the range of 2 V to 3 V.

Thus utilizing the fact that the anti-electric field varies as the thickness of the ferroelectric substance varies, it is possible to detect the maximum output voltage by detecting, using the polarization detecting circuit having the same low power source, whether or not the polarization is inverted.

What is claimed is:

1. A maximum voltage detecting apparatus comprising:
   (a) a ferroelectric device;
   (b) a reset circuit, connected to the ferroelectric device, for generating a maximum spontaneous polarization in said ferroelectric device; and
   (c) a polarization detecting circuit, connected to the ferroelectric device, for detecting a residual polarization generated in said ferroelectric device, the residual polarization generated when an external voltage is applied to said ferroelectric device, the polarization detecting circuit further determining the maximum voltage based on the residual polarization.

2. The maximum voltage detecting apparatus of claim 1, wherein said ferroelectric device comprises a ferroelectric substance positioned between two metal electrodes.

3. The maximum voltage detecting apparatus of claim 1, wherein said reset circuit includes a d.c. power source applying an electric field to said ferroelectric device, the applied electric field being greater than an anti-electric field of said ferroelectric device.

4. The maximum voltage detecting apparatus of claim 1, wherein said polarization detecting circuit includes a d.c. power source and a resistance connected in series, the d.c. power source applying an electric field to said ferroelectric device, the applied electric field being greater than an anti-electric field of said ferroelectric device.

5. The maximum voltage detecting apparatus of claim 2, wherein said ferroelectric substance is made from PZT.

6. A maximum voltage detecting apparatus comprising:
   (a) a ferroelectric unit comprising a plurality of ferroelectric devices connected in parallel, each ferroelectric device having a thickness different than the thickness of the other ferroelectric devices;
   (b) a reset circuit., connected to the ferroelectric unit, for generating a corresponding maximum spontaneous polarization in each of said plurality of ferroelectric devices of said ferroelectric unit; and
   (c) a polarization detecting circuit connected to the ferroelectric unit, for detecting a corresponding residual polarization generated in each of said ferroelectric devices of said ferroelectric unit, the corresponding residual polarization generated when an external voltage is applied to each of the plurality of ferroelectric devices, the polarization detecting circuit determining a maximum voltage based on the residual polarization.

7. The maximum voltage detecting apparatus of claim 6, wherein each ferroelectric device comprises a corresponding ferroelectric substance positioned between two metal electrodes.

8. The maximum voltage detecting apparatus of claim 6, wherein said reset circuit includes a d.c. power source applying an electric field to said ferroelectric unit, the electric field being greater than an anti-electric field of said ferroelectric unit.

9. The maximum voltage detecting apparatus of claim 6, wherein said polarization detecting circuit includes a d.c. power source and a resistance connected in series, the d.c. power supply applying an electric field to said ferroelectric unit, the applied electric field being greater than an anti-electric field of each of said ferroelectric devices of said ferroelectric unit.

10. The maximum voltage detecting apparatus of claim 6, further including a switching means for selectively connecting said polarization detecting circuit with each ferroelectric device of said ferroelectric unit.

11. The maximum voltage detecting apparatus of claim 7, wherein said ferroelectric substance is made from PZT.

12. The maximum voltage detecting apparatus of claim 6, wherein each of said ferroelectric devices includes a standard portion and a variable portion, said standard portion of each of said plurality of ferroelectric devices having a common thickness, said variable portion of each one of said plurality of ferroelectric devices having a different thickness than the variable portion of the other ones of the plurality of ferroelectric devices, each said ferroelectric device further including a plurality of metal electrodes disposed at opposite ends of the ferroelectric device, the plurality of metal electrodes being positioned between said standard portion and said variable portion.

* * * * *